US010475694B2

(12) United States Patent
Usenko

(10) Patent No.: US 10,475,694 B2
(45) Date of Patent: Nov. 12, 2019

(54) HANDLE SUBSTRATE FOR USE IN MANUFACTURE OF SEMICONDUCTOR-ON-INSULATOR STRUCTURE AND METHOD OF MANUFACTURING THEREOF

(71) Applicant: SunEdison Semiconductor Limited (UEN201334164H), Singapore (SG)

(72) Inventor: Alex Usenko, Lake St. Louis, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 187 days.

(21) Appl. No.: 15/850,265

(22) Filed: Dec. 21, 2017

(65) Prior Publication Data

US 2018/0138080 A1 May 17, 2018

Related U.S. Application Data

(62) Division of application No. 15/070,060, filed on Mar. 15, 2016, now Pat. No. 9,881,832.
(Continued)

(51) Int. Cl.
*H01L 21/762* (2006.01)

(52) U.S. Cl.
CPC .............................. *H01L 21/76254* (2013.01)

(58) Field of Classification Search
CPC ........... H01L 21/02381; H01L 21/0245; H01L 21/02532; H01L 21/76254;
(Continued)

(56) References Cited

U.S. PATENT DOCUMENTS 4,501,060 A 2/1985 Frye et al.
4,755,865 A 7/1988 Wilson et al.
(Continued)

FOREIGN PATENT DOCUMENTS

EP 0939430 A2 1/1999
EP 2426701 A1 7/2012
(Continued)

OTHER PUBLICATIONS

Gamble, H.S. et al., Low-loss CPW Lines on Surface Stabilized High-Resistivity Silicon, IEEE Microwave and Guided Wave Letters, Oct. 1999, pp. 395-397, vol. 9, No. 10.
(Continued)

*Primary Examiner* — Duy T Nguyen
(74) *Attorney, Agent, or Firm* — Armstrong Teasdale LLP

(57) ABSTRACT

A method is provided for preparing a high resistivity silicon handle substrate for use in semiconductor-on-insulator structure. The handle substrate is prepared to comprise thermally stable charge carrier traps in the region of the substrate that will be at or near the buried oxide layer (BOX) of the final semiconductor-on-insulator structure. The handle substrate comprising the stable carrier traps is manufactured by hydrogen ions implantation occurring using at least two different energies, followed by a 2-step thermal treatment. The thermally stable defect structures prepared thereby is stable to anneal at temperatures of at least 1180° C. The defect structure comprises 3-dimensional network of nanocavities interconnected by dislocations. This wafer can be used as a handle wafer for fabricating silicon-on-insulator (SOI) wafers and further fabricating radio frequency (RF) semiconductor devices.

36 Claims, 5 Drawing Sheets

Related U.S. Application Data

(60) Provisional application No. 62/134,178, filed on Mar. 17, 2015.

(58) Field of Classification Search
CPC .......... H01L 21/02502; H01L 21/0251; H01L 21/02694; H01L 21/0262; H01L 21/263; H01L 29/1054; H01L 29/165; C30B 1/023; C30B 31/22
USPC ...................................................... 438/510
See application file for complete search history.

(56) References Cited

U.S. PATENT DOCUMENTS

| | | | |
|---|---|---|---|
| 4,968,384 A | 11/1990 | Asano | |
| 5,189,500 A | 2/1993 | Kusunoki | |
| 5,953,622 A * | 9/1999 | Lee | H01L 21/76254 438/458 |
| 6,043,138 A | 3/2000 | Ibok | |
| 6,346,459 B1 | 2/2002 | Usenko et al. | |
| 6,373,113 B1 | 4/2002 | Gardner et al. | |
| 6,562,127 B1 | 5/2003 | Kud et al. | |
| 6,624,047 B1 | 9/2003 | Sakaguchi et al. | |
| 7,829,434 B2 * | 11/2010 | Yamazaki | H01L 21/2236 438/458 |
| 7,868,419 B1 | 1/2011 | Kerr et al. | |
| 7,879,699 B2 | 2/2011 | Schulze et al. | |
| 7,915,706 B1 | 3/2011 | Kerr et al. | |
| 8,058,137 B1 | 11/2011 | Or-Bach et al. | |
| 8,076,750 B1 | 12/2011 | Kerr et al. | |
| 8,466,036 B2 | 6/2013 | Brindle et al. | |
| 8,481,405 B2 | 7/2013 | Arriagada et al. | |
| 8,796,116 B2 | 8/2014 | Grabbe et al. | |
| 8,846,493 B2 | 9/2014 | Libbert et al. | |
| 8,859,393 B2 | 10/2014 | Ries et al. | |
| 9,202,711 B2 | 12/2015 | Liu et al. | |
| 2002/0090758 A1 | 7/2002 | Henley et al. | |
| 2002/0187619 A1 * | 12/2002 | Kleinhenz | H01L 21/76259 438/471 |
| 2004/0005740 A1 | 1/2004 | Lochtefeld et al. | |
| 2004/0031979 A1 | 2/2004 | Lochtefeld et al. | |
| 2004/0108537 A1 | 6/2004 | Tiwari | |
| 2005/0153524 A1 * | 7/2005 | Maa | H01L 21/76254 438/458 |
| 2006/0030124 A1 | 2/2006 | Maa et al. | |
| 2006/0033110 A1 | 2/2006 | Alam et al. | |
| 2006/0160327 A1 * | 7/2006 | Barna | H01L 21/76254 438/455 |
| 2006/0226482 A1 | 10/2006 | Suvorov | |
| 2007/0032040 A1 | 2/2007 | Lederer | |
| 2007/0054466 A1 | 3/2007 | Hebras | |
| 2009/0004833 A1 | 1/2009 | Suzuki et al. | |
| 2009/0014828 A1 | 1/2009 | Mizushima et al. | |
| 2009/0087631 A1 * | 4/2009 | Schulze | H01L 21/263 428/213 |
| 2009/0092810 A1 | 4/2009 | Lee et al. | |
| 2009/0321829 A1 | 12/2009 | Nguyen et al. | |
| 2011/0174362 A1 | 7/2011 | Tanner et al. | |
| 2011/0298083 A1 * | 12/2011 | Yoneda | H01L 21/3226 257/506 |
| 2012/0016310 A1 | 1/2012 | Holliday et al. | |
| 2012/0091587 A1 | 4/2012 | Or-Bach et al. | |
| 2012/0238070 A1 | 9/2012 | Libbert et al. | |
| 2012/0267681 A1 | 10/2012 | Nemoto et al. | |
| 2013/0120951 A1 | 5/2013 | Zuo et al. | |
| 2013/0122672 A1 | 5/2013 | Or-Bach et al. | |
| 2013/0168835 A1 | 7/2013 | Botula et al. | |
| 2013/0193445 A1 | 8/2013 | Dennard et al. | |
| 2013/0294038 A1 | 11/2013 | Landru et al. | |
| 2013/0344680 A1 | 12/2013 | Arriagada et al. | |
| 2014/0042598 A1 | 2/2014 | Kitada et al. | |
| 2014/0070215 A1 | 3/2014 | Bedell et al. | |
| 2014/0084290 A1 | 3/2014 | Allibert et al. | |
| 2014/0120654 A1 | 5/2014 | Fujii et al. | |
| 2014/0124902 A1 | 5/2014 | Botula et al. | |
| 2014/0273405 A1 | 9/2014 | Liu et al. | |
| 2014/0273461 A1 * | 9/2014 | Lee | C23C 16/26 438/694 |
| 2015/0004778 A1 | 1/2015 | Botula et al. | |
| 2015/0115480 A1 | 4/2015 | Peidous et al. | |

FOREIGN PATENT DOCUMENTS

| | | |
|---|---|---|
| JP | 2012253364 A | 12/2012 |
| WO | 2009120407 A2 | 10/2009 |
| WO | 2012127006 A1 | 9/2012 |

OTHER PUBLICATIONS

Lederer, D. et al., Enhanced High resistivity SOI wafers for RF Applications, 2004, IEEE International SOI Conference, Oct. 2004, pp. 46-47.

Lederer D. et al., New Substrate Passivation Method Dedicated to HR SOI Wafer Fabrication With Increased Substrate Resistivity, IEEE Electron Device Letters, Nov. 2005, pp. 805-807, vol. 26, No. 11.

Lederer, D. et al., Performance of SOI devices transferred onto passivated HR SOI substrates using a layer transfer technique, 2006, IEEE International SOI Conference Proceedings, 2006, pp. 29-30.

Kerr, Daniel C., Identification of RF harmonic distortion of Si substrates and its reduction using a trap-rich layer, IEEE (IEEE Topical Meeting), 2008, pp. 151-154.

Blicher, Adolph, Field-Effect and Bipolar Power Transistor Physics, Book, 1981, pp. 61-64, Academic Press, Inc.

Morkc, Hadis, Nanoheteroepitaxy and nano-ELO; Handbook of Nitride Semiconductors and Devices, Materials Properties, Physics, and Growth, 2009, Wiley, pp. 564-569, vol. 1, Chapter 3.5.5.3.

Zamir, S. et al., Reduction of cracks in GaN films on Si-on-insulator by lateral confined epitaxy, Journal of Crystal Growth, Elsevier Amsterdam, NL, Sep. 2002, pp. 375-380, vol. 243, No. 3-4.

Gao, Min, et al., A transmission electron microscopy study of microstructural defects in proton implanted silicon, Journal of Applied Physics, Oct. 15, 1996 American Institute of Physcis, pp. 4767-4769, vol. 70, No. 8.

Gao, Min, et al., Two-dimensional network of dislocations and nanocavities in hydrogen-implanted and two-step annealed silicon, Applied Physcis Letters, American Institute of Physics May 18, 1998, pp. 2544-2546 vol. 72, No. 20.

International Search Report and Written Opinion of the International Searching Authority regarding PCT/US2015/048041 dated Dec. 3, 2015; 12 pgs.

International Search Report and Written Opinion of the International Searching Authority regarding PCT/SG2015/050299 dated Dec. 3, 2015; 14 pgs.

International Search Report and Written Opinion of the International Searching Authority regarding PCT/SG2015/050300 dated Dec. 3, 2015; 14 pgs.

International Search Report and Written Opinion of the International Searching Authority regarding PCT/US2015/060854 dated Feb. 4, 2015; 14 pgs.

International Search Report and Written Opinion of the International Searching Authority regarding PCT/US2015/060871 dated Mar. 21, 2016; 12 pgs.

International Search Report and Written Opinion of the International Searching Authority regarding PCT/US2015060674 dated Feb. 4, 2016; 14 pgs.

International Search Report and Written Opinion of the International Searching Authority regarding PCT/US2015/060885 dated Jan. 26, 2016; 12 pgs.

* cited by examiner

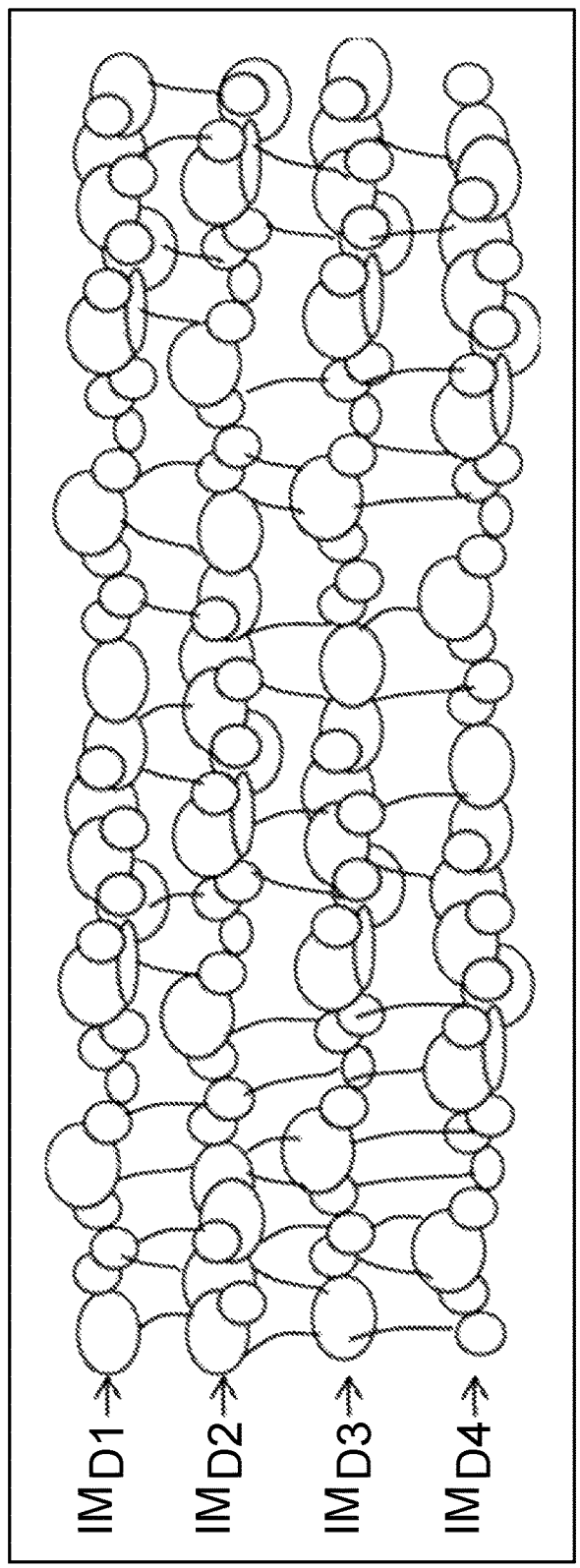

HANDLE SUBSTRATE FOR USE IN MANUFACTURE OF SEMICONDUCTOR-ON-INSULATOR STRUCTURE AND METHOD OF MANUFACTURING THEREOF

CROSS REFERENCE TO RELATED APPLICATION

This is a divisional application of U.S. patent application Ser. No. 15/070,060, which was filed Mar. 15, 2016. U.S. patent application Ser. No. 15/070,060 claims the benefit of U.S. Provisional Application Ser. No. 62/134,178, which was filed Mar. 17, 2015. Both priority applications are hereby incorporated by reference as if set forth in their entirety.

THE FIELD OF THE INVENTION

The present invention generally relates to the field of semiconductor wafer manufacture. More specifically, the present invention relates to a method of preparing a handle substrate for use in the manufacture of a semiconductor-on-insulator (e.g., silicon-on-insulator) structure, and more particularly to a method for producing a charge trapping layer in the handle wafer of the semiconductor-on-insulator structure.

BACKGROUND OF THE INVENTION

Semiconductor wafers are generally prepared from a single crystal ingot (e.g., a silicon ingot) which is trimmed and ground to have one or more flats or notches for proper orientation of the wafer in subsequent procedures. The ingot is then sliced into individual wafers. While reference will be made herein to semiconductor wafers constructed from silicon, other materials may be used to prepare semiconductor wafers, such as germanium, silicon carbide, silicon germanium, gallium arsenide, and other alloys of Group III and Group V elements, such as gallium nitride or indium phosphide, or alloys of Group II and Group VI elements, such as cadmium sulfide or zinc oxide.

Semiconductor wafers (e.g., silicon wafers) may be utilized in the preparation of composite layer structures. A composite layer structure (e.g., a semiconductor-on-insulator, and more specifically, a silicon-on-insulator (SOI) structure) generally comprises a handle wafer or layer, a device layer, and an insulating (i.e., dielectric) film (typically an oxide layer) between the handle layer and the device layer. Generally, the device layer is between 0.01 and 20 micrometers thick, such as between 0.05 and 20 micrometers thick. Thick film device layers may have a device layer thickness between about 1.5 micrometers and about 20 micrometers. Thin film device layers may have a thickness between about 0.01 micrometer and about 0.20 micrometer. In general, composite layer structures, such as silicon-on-insulator (SOI), silicon-on-sapphire (SOS), and silicon-on-quartz, are produced by placing two wafers in intimate contact, thereby initiating bonding by van der Waal's forces, followed by a thermal treatment to strengthen the bond. The anneal may convert the terminal silanol groups to siloxane bonds between the two interfaces, thereby strengthening the bond.

After thermal anneal, the bonded structure undergoes further processing to remove a substantial portion of the donor wafer to achieve layer transfer. For example, wafer thinning techniques, e.g., etching or grinding, may be used, often referred to as back etch SOI (i.e., BESOI), wherein a silicon wafer is bound to the handle wafer and then slowly etched away until only a thin layer of silicon on the handle wafer remains. See, e.g., U.S. Pat. No. 5,189,500, the disclosure of which is incorporated herein by reference as if set forth in its entirety. This method is time-consuming and costly, wastes one of the substrates and generally does not have suitable thickness uniformity for layers thinner than a few microns.

Another common method of achieving layer transfer utilizes a hydrogen implant followed by thermally induced layer splitting. Particles (atoms or ionized atoms, e.g., hydrogen atoms or a combination of hydrogen and helium atoms) are implanted at a specified depth beneath the front surface of the donor wafer. The implanted particles form a cleave plane in the donor wafer at the specified depth at which they were implanted. The surface of the donor wafer is cleaned to remove organic compounds or other contaminants, such as boron compounds, deposited on the wafer during the implantation process.

The front surface of the donor wafer is then bonded to a handle wafer to form a bonded wafer through a hydrophilic bonding process. Prior to bonding, the donor wafer and/or handle wafer are activated by exposing the surfaces of the wafers to plasma containing, for example, oxygen or nitrogen. Exposure to the plasma modifies the structure of the surfaces in a process often referred to as surface activation, which activation process renders the surfaces of one or both of the donor water and handle wafer hydrophilic. The surfaces of the wafers can be additionally chemically activated by a wet treatment, such as an SC1 clean or hydrofluoric acid. The wet treatment and the plasma activation may occur in either order, or the wafers may be subjected to only one treatment. The wafers are then pressed together, and a bond is formed there between. This bond is relatively weak, due to van der Waal's forces, and must be strengthened before further processing can occur.

In some processes, the hydrophilic bond between the donor wafer and handle wafer (i.e., a bonded wafer) is strengthened by heating or annealing the bonded wafer pair. In some processes, wafer bonding may occur at low temperatures, such as between approximately 300° C. and 500° C. The elevated temperatures cause the formation of covalent bonds between the adjoining surfaces of the donor wafer and the handle wafer, thus solidifying the bond between the donor wafer and the handle wafer. Concurrently with the heating or annealing of the bonded wafer, the particles earlier implanted in the donor wafer weaken the cleave plane.

A portion of the donor wafer is then separated (i.e., cleaved) along the cleave plane from the bonded wafer to form the SOI wafer. Cleaving may be carried out by placing the bonded wafer in a fixture in which mechanical force is applied perpendicular to the opposing sides of the bonded wafer in order to pull a portion of the donor wafer apart from the bonded wafer. According to some methods, suction cups are utilized to apply the mechanical force. The separation of the portion of the donor wafer is initiated by applying a mechanical wedge at the edge of the bonded wafer at the cleave plane in order to initiate propagation of a crack along the cleave plane. The mechanical force applied by the suction cups then pulls the portion of the donor wafer from the bonded wafer, thus forming an SOI wafer.

According to other methods, the bonded pair may instead be subjected to an elevated temperature over a period of time to separate the portion of the donor wafer from the bonded wafer. Exposure to the elevated temperature causes initiation and propagation of cracks along the cleave plane, thus separating a portion of the donor wafer. The crack forms due to the formation of voids from the implanted ions, which grow by Ostwald ripening. The voids are filled with hydrogen and helium. The voids become platelets. The pressurized gases in the platelets propagate micro-cavities and micro-cracks, which weaken the silicon on the implant plane. If the anneal is stopped at the proper time, the weakened bonded wafer may be cleaved by a mechanical process. However, if the thermal treatment is continued for a longer duration and/or at a higher temperature, the micro-crack propagation reaches the level where all cracks merge along the cleave plane, thus separating a portion of the donor wafer. This method allows for better uniformity of the transferred layer and allows recycle of the donor wafer, but typically requires heating the implanted and bonded pair to temperatures approaching 500° C.

The use of high resistivity semiconductor-on-insulator (e.g., silicon-on-insulator) wafers for RF related devices such as antenna switches offers benefits over traditional substrates in terms of cost and integration. To reduce parasitic power loss and minimize harmonic distortion inherent when using conductive substrates for high frequency applications it is necessary, but not sufficient, to use substrate wafers with a high resistivity. Accordingly, the resistivity of the handle wafer for an RF device is generally greater than about 500 Ohm-cm. With reference now to FIG. 1, a silicon on insulator structure 2 comprising a very high resistivity silicon wafer 4, a buried oxide (BOX) layer 6, and a silicon device layer 10. Such a substrate is prone to formation of high conductivity charge inversion or accumulation layers 12 at the BOX/handle interface causing generation of free carriers (electrons or holes), which reduce the effective resistivity of the substrate and give rise to parasitic power losses and device nonlinearity when the devices are operated at RF frequencies. These inversion/accumulation layers can be due to BOX fixed charge, oxide trapped charge, interface trapped charge, and even DC bias applied to the devices themselves.

A method is required therefore to trap the charge in any induced inversion or accumulation layers so that the high resistivity of the substrate is maintained even in the very near surface region. It is known that charge trapping layers (CTL) between the high resistivity handle substrates and the buried oxide (BOX) may improve the performance of RF devices fabricated using SOI wafers. A number of methods have been suggested to form these high interface trap layers. For example, with reference now to FIG. 2, one of the method of creating a semiconductor-on-insulator 20 (e.g., a silicon-on-insulator, or SOI) with a CTL for RF device applications is based on depositing an undoped polycrystalline silicon film 28 on a silicon substrate having high resistivity 22 and then forming a stack of oxide 24 and top silicon layer 26 on it. A polycrystalline silicon layer 28 acts as a high defectivity layer between the silicon substrate 22 and the buried oxide layer 24. See FIG. 2, which depicts a polycrystalline silicon film for use as a charge trapping layer 28 between a high resistivity substrate 22 and the buried oxide layer 24 in a silicon-on-insulator structure 20. An alternative method is the implantation of heavy ions to create a near surface damage layer. Devices, such as radiofrequency devices, are built in the top silicon layer 26.

It has been shown in academic studies that the polycrystalline silicon layer in between of the oxide and substrate improves the device isolation, decreases transmission line losses and reduces harmonic distortions. See, for example: H. S. Gamble, et al."Low-loss CPW lines on surface stabilized high resistivity silicon," *Microwave Guided Wave Lett.*, 9(10), pp. 395-397, 1999; D. Lederer, R. Lobet and J.-P. Raskin, "Enhanced high resistivity SOI wafers for RF applications," *IEEE Intl. SOI Conf.*, pp. 46-47, 2004; D. Lederer and J.-P. Raskin, "New substrate passivation method dedicated to high resistivity SOI wafer fabrication with increased substrate resistivity," *IEEE Electron Device Letters*, vol. 26, no. 11, pp. 805-807, 2005; D. Lederer, B. Aspar, C. Laghaé and J.-P. Raskin, "Performance of RF passive structures and SOI MOSFETs transferred on a passivated HR SOI substrate," *IEEE International SOI Conference*, pp. 29-30, 2006; and Daniel C. Kerret al. "Identification of RF harmonic distortion on Si substrates and its reduction using a trap-rich layer", Silicon Monolithic Integrated Circuits in RF Systems, 2008. SiRF 2008 (IEEE Topical Meeting), pp. 151-154, 2008.

The properties of polycrystalline silicon charge trapping layer depends upon the thermal treatments the semiconductor-on-insulator (e.g., silicon-on-insulator) receives. A problem that arises with these methods is that the defect density in the layer and interface tend to anneal out and become less effective at charge trapping as the wafers are subjected to the thermal processes required to make the wafers and build devices on them. Accordingly, the effectiveness of polycrystalline silicon CTL depends on the thermal treatments that SOI receives. In practice, the thermal budget of SOI fabrication and device processing is so high that the charge traps in conventional polycrystalline silicon are essentially eliminated. The charge trapping efficiency of these films becomes very poor.

SUMMARY OF THE INVENTION

In one aspect, the objective of this invention is to provide a method of manufacturing semiconductor-on-insulator (e.g., silicon-on-insulator) wafers with thermally stable charge trapping layers, which preserve the charge trapping effectiveness and significantly improve the performance of completed RF devices.

Briefly, the present invention is directed to a method of preparing a single crystal semiconductor handle substrate, the single crystal semiconductor handle substrate comprising two major, generally parallel surfaces, one of which is a front surface of the semiconductor handle substrate and the other of which is a back surface of the semiconductor handle substrate, an imaginary central plane between the front surface and the back surface, a circumferential edge joining the front and back surfaces of the semiconductor handle substrate, a front surface region extending from the front surface and toward the central plane and having a depth, $FS_D$, and a bulk region between the front and back surfaces of the semiconductor handle substrate, wherein the semiconductor handle substrate has a minimum bulk region resistivity of at least about 500 ohm-cm, and the method comprises: implanting hydrogen ions to a first implant depth, $IM_{D1}$, corresponding to a plane of a first peak hydrogen ion concentration in the front surface region of the single crystal semiconductor handle substrate, wherein $IM_{D1}$ is measured from the front surface of the single crystal semiconductor handle substrate and toward the central plane; implanting hydrogen ions to a second implant depth, $IM_{D2}$, corresponding to a plane of a second peak hydrogen ion concentration in the front surface region of the single crystal semiconductor handle substrate, wherein $IM_{D2}$ is measured from the front surface of the single crystal semiconductor handle substrate and toward the central plane; and annealing the hydrogen ion implanted single crystal semiconductor handle substrate at a temperature and a duration sufficient to form a three-dimensional network of dislocations and cavities in the front surface region of the single crystal semiconductor handle substrate, wherein the depth, $FS_D$, of the front surface region is less than 20 micrometers, and further wherein the first implant depth, $IM_{D1}$, corresponding to the plane of the first peak hydrogen ion concentration and the second implant depth, $IM_{D2}$, corresponding to the plane of the second peak hydrogen ion concentration are separated by at least about 10 nanometers and no more than about 750 nanometers.

The present invention is further directed to a multilayer structure comprising: a single crystal semiconductor handle substrate comprising two major, generally parallel surfaces, one of which is a front surface of the semiconductor handle substrate and the other of which is a back surface of the semiconductor handle substrate, an imaginary central plane between the front surface and the back surface, a circumferential edge joining the front and back surfaces of the semiconductor handle substrate, a front surface region extending from the front surface and toward the central plane and having a depth, $FS_D$, and a bulk region between the front and back surfaces of the semiconductor handle substrate, wherein the semiconductor handle substrate has a minimum bulk region resistivity of at least about 500 ohm-cm and further wherein the front surface region comprises a three-dimensional network of dislocations and cavities extending from a first plane facing the front surface side of the substrate toward a second plane facing the imaginary central plane of the substrate; a dielectric layer in interfacial contact with the front surface of the single crystal semiconductor handle substrate; and a single crystal semiconductor device layer in interfacial contact with the dielectric layer.

Other objects and features of this invention will be in part apparent and in part pointed out hereinafter.

BRIEF DESCRIPTION OF THE DRAWINGS

FIG. 6 is a depiction of a three-dimensional network of cavities and dislocations, with planes of cavities generally corresponding to peak hydrogen ion concentration having depths $IM_{D1}$, $IM_{D2}$, $IM_{D3}$, and $IM_{D4}$. The three-dimensional network may act as a charge trapping layer in a resultant semiconductor-on-insulator structure.

DETAILED DESCRIPTION OF THE EMBODIMENT(S) OF THE INVENTION

According to the present invention, a method is provided for producing a charge trapping layer in a front surface region of a single crystal semiconductor handle substrate, e.g., a single crystal semiconductor handle wafer, such as a single crystal silicon handle wafer. The single crystal semiconductor handle wafer comprising the charge trapping layer is useful in the production of a semiconductor-on-insulator (e.g., silicon-on-insulator) structure. According to the present invention, the charge trapping layer in the single crystal semiconductor handle wafer is formed in the front surface region of the handle substrate near the interface with the dielectric layer, which is commonly a buried oxide layer or BOX. Advantageously, the method of the present invention provides a charge trapping layer that is stable against thermal processing, such as subsequent thermal process steps in the production of the semiconductor-on-insulator substrate and device manufacture.

Figure 1:
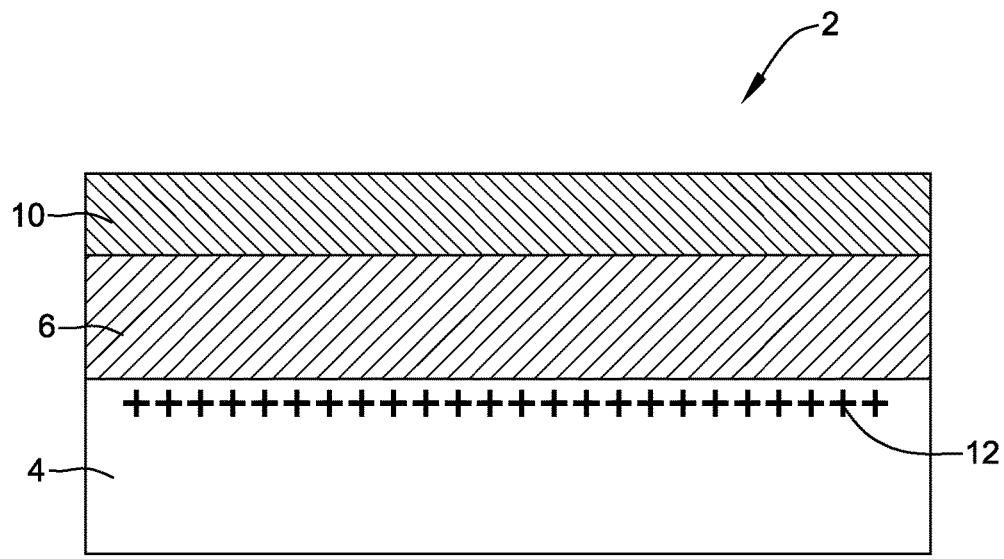
FIG. 1 is a depiction of a silicon-on-insulator wafer comprising a high resistivity substrate and a buried oxide layer.
Figure 2:
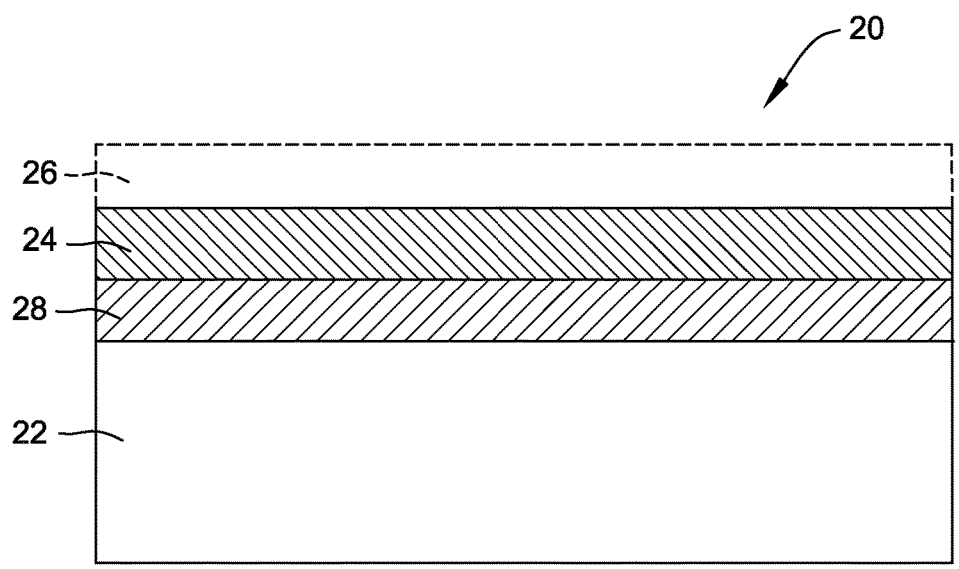
FIG. 2 is a depiction of a silicon-on-insulator wafer according to the prior art, the SOI wafer comprising a polycrystalline silicon charge trapping layer between a high resistivity substrate and a buried oxide layer.
Figure 3:
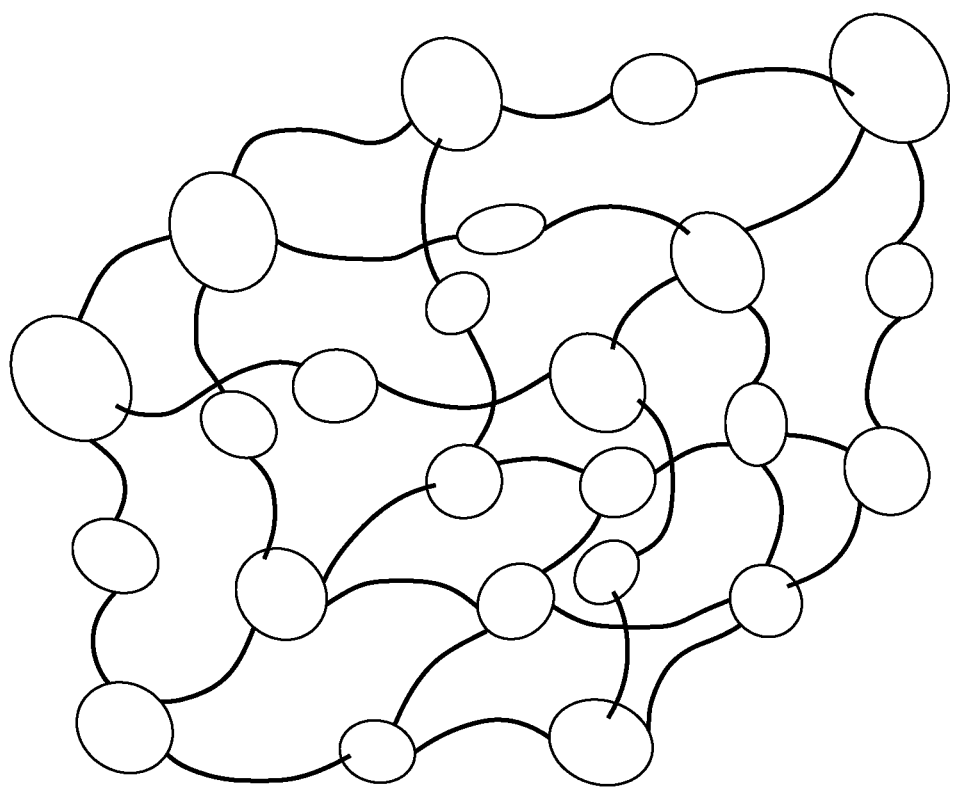
FIG. 3 is an illustration of a thermally stable three-dimensional network of cavities interconnected by dislocations.

In some embodiments of the present invention, a single crystal semiconductor handle substrate is prepared to comprise a charge trapping layer. The charge trapping layer comprises stable charge carrier traps manufactured by a method including hydrogen ion implantation, followed by a 2-step thermal treatment. In some embodiments, the hydrogen ion implantation comprises hydrogen ion implantation to two or more peak depths of hydrogen ion concentration, such as three or more depths of hydrogen ion concentration, or even four or more peak depths of hydrogen ion concentration, or more, such as five, six, or even seven or more peak depths of hydrogen ion concentration. The handle substrate comprising multiple planes of peak hydrogen ion concentrations is then subjected to a 2-step thermal treatment to thereby prepare a defect structure comprising a 3-dimensional network of nano-cavities interconnected by dislocations. In some embodiments, the 2-step thermal treatment comprises a first thermal treatment step in which cavities form around the multiple planes of peak hydrogen ion concentration. In some embodiments, the 2-step thermal treatment comprises a second thermal treatment step in which cavities become interconnected by dislocations. The dislocations may connect cavities horizontally, i.e., within a plane of cavities formed by anneal of the hydrogen ion implanted handle wafers, and vertically, i.e., between neighboring planes of cavities. See FIG. 3 for an illustration of an interconnected network of cavities within a plane. See FIG. 6 for an exemplary depiction of a three-dimensional network of cavities and dislocations, with planes of cavities generally corresponding to peak hydrogen ion concentration having depths $IM_{D1}$, $IM_{D2}$, $IM_{D3}$, and $IM_{D4}$. The three-dimensional network may act as a charge trapping layer in a resultant semiconductor-on-insulator structure. The method of the present invention includes an anneal process suitable for connecting neighboring planes of cavities. The three-dimensional network of cavities interconnected by dislocations is thermally stable. For example, in some embodiments, the thermally stable defect structures prepared thereby is stable to anneal at temperatures of at least 1180° C.

When this quasi-lattice is formed in the front surface region of the handle substrate at or near the interface with the dielectric layer (e.g., buried oxide), and further transformed into semiconductor-on-insulator (e.g., silicon-on-insulator) structure, it can advantageously serve as the trap rich layer. Upon high temperature annealing, the cavities may lose trapping capacity because they undergo oxidation of their internal walls. However, the interconnecting dislocations do not lose their trapping efficiency, and the trap rich band serves as an efficient charge trapping material. Accordingly, in some embodiments, the role of the cavities is to serve as locking points for the dislocations, so this unique dislocation network survives high temperature treatments without getting annealed out.

Figure 4:
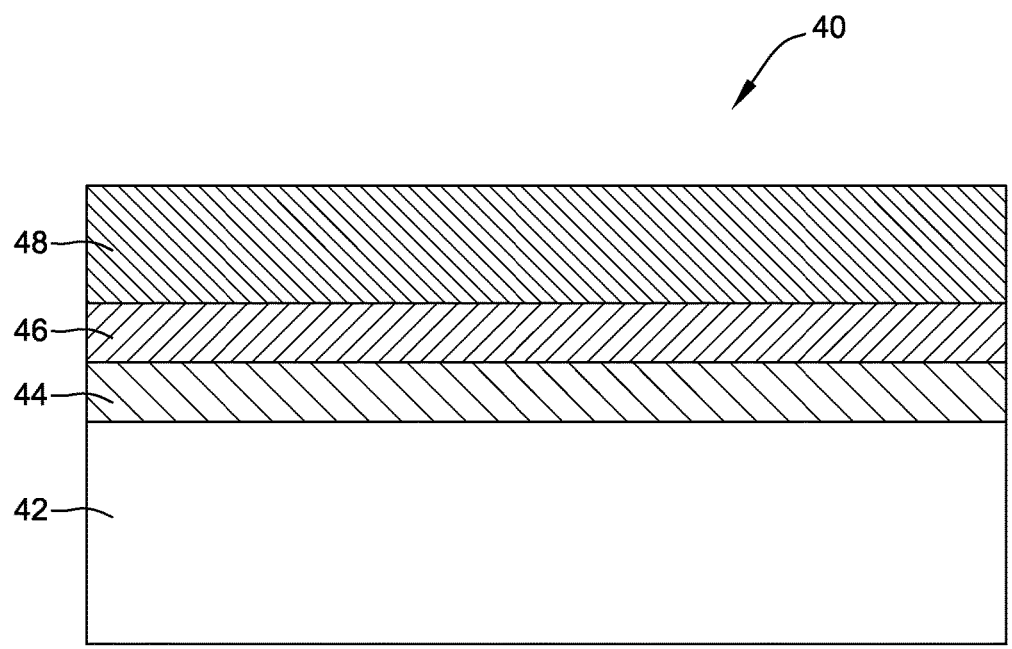
FIG. 4 is an illustration of a semiconductor-on-insulator structure according to the present invention.

The resulting handle substrate 42 is suitable for use in the manufacture of a semiconductor-on-insulator (e.g., siliconon-insulator) structure 40. With reference to FIG. 4, layer transfer is performed by conventional techniques thus creating a semiconductor-on-insulator (e.g., silicon-on-insulator) structure 40 comprising at least four layers: the handle substrate 42, the thermally stable charge trapping layer 44, a dielectric layer 46 (e.g., buried oxide) and a single crystal semiconductor device layer 48 (e.g., a silicon layer derived from a single crystal silicon donor substrate). The semiconductor-on-insulator (e.g., silicon-on-insulator) structure 40 of the present invention may be suitable for the fabrication of radiofrequency chips. Resulting chips have suppressed parasitic effects.

The substrates for use in the present invention include a semiconductor handle substrate 42, e.g., a single crystal semiconductor handle wafer and a semiconductor donor substrate, e.g., a single crystal semiconductor donor wafer. The semiconductor device layer 48 in a semiconductor-on-insulator composite structure 40 is derived from the single crystal semiconductor donor wafer. The semiconductor device layer 48 may be transferred onto the semiconductor handle substrate 42 by wafer thinning techniques such as etching a semiconductor donor substrate or by cleaving a semiconductor donor substrate comprising a damage plane. In general, the single crystal semiconductor handle substrate and single crystal semiconductor donor substrate comprise two major, generally parallel surfaces. One of the parallel surfaces is a front surface of the substrate, and the other parallel surface is a back surface of the substrate. The substrates comprise a circumferential edge joining the front and back surfaces, a bulk region between the front and back surfaces, and a central plane between the front and back surfaces. The substrates additionally comprise an imaginary central axis perpendicular to the central plane and a radial length that extends from the central axis to the circumferential edge. In addition, because semiconductor substrates, e.g., silicon wafers, typically have some total thickness variation (TTV), warp, and bow, the midpoint between every point on the front surface and every point on the back surface may not precisely fall within a plane. As a practical matter, however, the TTV, warp, and bow are typically so slight that to a close approximation the midpoints can be said to fall within an imaginary central plane which is approximately equidistant between the front and back surfaces.

Prior to any operation as described herein, the front surface and the back surface of the substrate may be substantially identical. A surface is referred to as a "front surface" or a "back surface" merely for convenience and generally to distinguish the surface upon which the operations of method of the present invention are performed. In the context of the present invention, a "front surface" of a single crystal semiconductor handle substrate, e.g., a single crystal silicon handle wafer, refers to the major surface of the substrate that becomes an interior surface of the bonded structure. With reference to both FIG. 4 and FIG. 5, the charge trapping layer 44 of the present invention is formed within the front surface region 112 of the single crystal semiconductor handle substrate 42. Accordingly, the single crystal semiconductor handle substrate 42 may be considered as having a front surface region 112 having a depth, $FS_D$, as measured from the front surface and toward the central plane. The length of $FS_D$ defines the depth of the front surface region 112 comprising the three-dimensional network of interconnected cavities formed according to the method of the present invention. The depth, $FS_D$, may vary between about 0.1 micrometer and about 50 micrometers, as measured from the front surface of the single crystal semiconductor handle substrate 42 toward the central plane. In some embodiments, the depth, $FS_D$, may be less than about 20 micrometers, such as between about 0.1 micrometer and about 20 micrometers. In some embodiments, the depth, $FS_D$, may be less than about 10 micrometers, such as between about 0.1 micrometer and about 10 micrometers, such as between about 0.1 micrometer and about 5 micrometers. Accordingly, the front surface region 112 comprises the three-dimensional network of dislocations and cavities prepared by the method of the present invention. In some embodiments, the three-dimensional network of dislocations and cavities may be defined by two approximately parallel horizontal planes. By "horizontal" herein, it is meant that the planes are generally parallel to the planes of the front and back surfaces of the single crystal semiconductor handle substrate 42. Dislocations connecting cavities within the same plane may be considered as generally "horizontal" or "horizontally" extending dislocations. Similarly, a "vertical" or "vertically" extending dislocations runs generally perpendicular to the front and back surfaces of the single crystal semiconductor handle substrate. Horizontal planes and horizontally extending dislocations are not precisely horizontal, nor are vertically extending dislocations precisely perpendicular due to variances in the thickness of the planes and the random paths a dislocation may assume. The planes formed by interconnecting cavities may be considered as generally horizontal. The three-dimensional network of dislocations and cavities prepared by the method of the present invention may comprise two or more generally horizontal planes, the planes defined by an interconnecting network of cavities and dislocations, wherein the cavities result from the two-step thermal anneal of the invention. The upper and lower limits of the network are generally defined by a first plane near to or facing the front surface side of the substrate and a second plane facing the imaginary central plane of the substrate. A "back surface" of a single crystal semiconductor handle substrate 42, e.g., a handle wafer, refers to the major surface that becomes an exterior surface of the semiconductor-on-insulator composite structure 40. Similarly, a "front surface" of a single crystal semiconductor donor substrate, e.g., a single crystal silicon donor wafer, refers to the major surface of the single crystal semiconductor donor substrate that becomes an interior surface of the semiconductor-on-insulator composite structure 40. The front surface of a single crystal semiconductor donor substrate often comprises a dielectric layer, e.g., a silicon dioxide layer, which forms the buried oxide (BOX) layer 46 in the final structure. A "back surface" of a single crystal semiconductor donor substrate, e.g., a single crystal silicon donor wafer, refers to the major surface that becomes an exterior surface of the semiconductor-on-insulator composite structure 40. Upon completion of conventional bonding and wafer thinning steps, the single crystal semiconductor donor substrate forms the semiconductor device layer 48 of the semiconductor-on-insulator (e.g., silicon-on-insulator) composite structure 40.

The semiconductor handle substrate 42 and the device layer 48 may comprise single crystal semiconductor material. In preferred embodiments, the semiconductor material may be selected from the group consisting of silicon, silicon carbide, sapphire, aluminum nitride, silicon germanium, gallium arsenide, gallium nitride, indium phosphide, indium gallium arsenide, germanium, and combinations thereof. The semiconductor handle substrate 42 and the device layer 48 may comprise the same semiconductor material, or they may be different. In view thereof, semiconductor-on-insulator composite structure 40 may comprise, e.g., silicon-on-insulator, sapphire-on-insulator, aluminum nitride-on-insulator, and other combinations. The single crystal semiconductor wafers, e.g., the single crystal silicon handle wafer and single crystal silicon donor wafer, of the present invention typically have a nominal diameter of at least about 150 mm, at least about 200 mm, at least about 300 mm, or at least about 450 mm. Wafer thicknesses may vary from about 250 micrometers to about 1500 micrometers, such as between about 300 micrometers and about 1000 micrometers, suitably within the range of about 500 micrometers to about 1000 micrometers. In some specific embodiments, the wafer thickness may be about 725 micrometers.

In particularly preferred embodiments, the single crystal semiconductor wafers, i.e., handle wafer and donor wafer, comprise single crystal silicon wafers which have been sliced from a single crystal ingot grown in accordance with conventional Czochralski crystal growing methods or float zone growing methods. Such methods, as well as standard silicon slicing, lapping, etching, and polishing techniques are disclosed, for example, in F. Shimura, Semiconductor Silicon Crystal Technology, Academic Press, 1989, and Silicon Chemical Etching, (J. Grabmaier ed.) Springer-Verlag, N.Y., 1982 (incorporated herein by reference). Preferably, the wafers are polished and cleaned by standard methods known to those skilled in the art. See, for example, W. C. O'Mara et al., *Handbook of Semiconductor Silicon Technology*, Noyes Publications. If desired, the wafers can be cleaned, for example, in a standard SC1/SC2 solution. In some embodiments, the single crystal silicon wafers of the present invention are single crystal silicon wafers which have been sliced from a single crystal ingot grown in accordance with conventional Czochralski ("Cz") crystal growing methods, typically having a nominal diameter of at least about 150 mm, at least about 200 mm, at least about 300 mm, or at least about 450 mm. Preferably, both the single crystal silicon handle wafer and the single crystal silicon donor wafer have mirror-polished front surface finishes that are free from surface defects, such as scratches, large particles, etc. Wafer thickness may vary from about 250 micrometers to about 1500 micrometers, such as between about 300 micrometers and about 1000 micrometers, suitably within the range of about 500 micrometers to about 1000 micrometers. In some specific embodiments, the wafer thickness may be about 725 micrometers.

In some embodiments, the single crystal semiconductor handle substrate and the single crystal semiconductor donor substrate, i.e., single crystal semiconductor handle wafer and single crystal semiconductor donor wafer, comprise interstitial oxygen in concentrations that are generally achieved by the Czochralski-growth method. In some embodiments, the semiconductor wafers comprise oxygen in a concentration between about 4 PPMA and about 18 PPMA. In some embodiments, the semiconductor wafers comprise oxygen in a concentration between about 10 PPMA and about 35 PPMA. Preferably, the single crystal silicon handle wafer comprises oxygen in a concentration of no greater than about 10 ppma. Interstitial oxygen may be measured according to SEMI MF 1188-1105.

The single crystal semiconductor handle substrate may have any resistivity obtainable by the Czochralski or float zone methods. In some embodiments, the single crystal semiconductor handle substrate has a relatively low minimum bulk resistivity, such as below about 100 ohm-cm, below about 50 ohm-cm, below about 1 ohm-cm, below about 0.1 ohm-cm, or even below about 0.01 ohm-cm. In some embodiments, the single crystal semiconductor handle substrate has a relatively low minimum bulk resistivity, such as below about 100 ohm-cm, or between about 1 ohm-cm and about 100 ohm-cm. Low resistivity wafers may comprise electrically active dopants, such as boron (p type), gallium (p type), phosphorus (n type), antimony (n type), and arsenic (n type).

In some embodiments, the single crystal semiconductor handle substrate has a relatively high minimum bulk resistivity. High resistivity wafers are generally sliced from single crystal ingots grown by the Czochralski method or float zone method. High resistivity wafers may comprise electrically active dopants, such as boron (p type), gallium (p type), aluminum (p type), indium (p type), phosphorus (n type), antimony (n type), and arsenic (n type), in generally very low concentrations. Cz-grown silicon wafers may be subjected to a thermal anneal at a temperature ranging from about 600° C. to about 1000° C. in order to annihilate thermal donors caused by oxygen that are incorporated during crystal growth. In some embodiments, the single crystal semiconductor handle wafer has a minimum bulk resistivity of at least 100 Ohm-cm, at least about 500 Ohm-cm, at least about 1000 Ohm-cm, or even at least about 3000 Ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 Ohm-cm, between about 2000 Ohm-cm and about 10,000 Ohm-cm, between about 3000 Ohm-cm and about 10,000 Ohm-cm, or between about 3000 Ohm cm and about 5,000 Ohm-cm. Methods for preparing high resistivity wafers are known in the art, and such high resistivity wafers may be obtained from commercial suppliers, such as SunEdison Semiconductor Ltd. (St. Peters, Mo.; formerly MEMC Electronic Materials, Inc.).

In some embodiments, the single crystal semiconductor handle substrate surface could be intentionally damaged by a sound blasting process or by a caustic etch. In some embodiments, the front surface of the handle substrate may be cleaned to remove organic and particulate contamination. A suitable cleaning operation is the piranha clean. The piranha clean may comprise a mixture of concentrated sulfuric acid to 30% hydrogen peroxide solution, typically in the proportion from 3:1 to 7:1.

In some embodiments, prior to hydrogen ion implantation, the front surface of the single crystal semiconductor handle substrate may be subjected to an oxidation process to thereby grow a dielectric layer, such as a semiconductor oxide layer, a semiconductor nitride layer, or a semiconductor oxynitride layer. In some embodiments, the dielectric layer comprises silicon dioxide, which may be formed by oxidizing the front surface of the silicon handle substrate. This may be accomplished by means known in the art, such as thermal oxidation (in which some portion of the deposited semiconductor material film will be consumed) and/or CVD oxide deposition. In some embodiments, the semiconductor handle substrate may be thermally oxidized in a furnace such as an ASM A400. The temperature may range from 750° C. to 1100° C. in an oxidizing ambient. The oxidizing ambient atmosphere can be a mixture of inert gas, such as Ar or $N_2$, and $O_2$. The oxygen content may vary from 1 to 10 percent, or higher. In some embodiments, the oxidizing ambient atmosphere may be up to 100% (a "dry oxidation"). In some embodiments, the ambient atmosphere may comprise a mixture of inert gas, such as Ar or $N_2$, and oxidizing gases, such as $O_2$ and water vapor (a "wet oxidation"). In an exemplary embodiment, semiconductor handle wafers may be loaded into a vertical furnace, such as an A400. The temperature is ramped to the oxidizing temperature with a mixture of $N_2$ and $O_2$. At the desired temperature water vapor is introduced into the gas flow. After the desired oxide thickness has been obtained, the water vapor and $O_2$ are turned off and the furnace temperature is reduced and wafers are unloaded from the furnace. In some embodiments, the handle substrates are oxidized to provide an oxide layer between about 100 nanometers to about 2 micrometers, such as between about 200 nanometers and about 1 micrometer, or between about 200 nanometers and about 500 nanometers.

After oxidation, in some embodiments, it may be desirable to subject the handle substrate to a clean. In some preferred embodiments, the clean could include a Piranha clean followed by a DI water rinse and SC1/SC2 cleans. In some embodiments, the handle substrate may be cleaned by exposure to an SC1 solution. In some embodiments, the SC1 solution comprises 5 parts deoinized water, 1 part aqueous $NH_4OH$ (ammonium hydroxide, 29% by weight of $NH_3$), and 1 part of aqueous $H_2O_2$ (hydrogen peroxide, 30%). In some embodiments, the handle substrate may be cleaned by exposure to an SC2 solution. In some embodiments, the SC2 solution comprises 5 parts deoinized water, 1 part aqueous HO (hydrochloric acid, 39% by weight), and 1 part of aqueous $H_2O_2$ (hydrogen peroxide, 30%).

Figure 5:
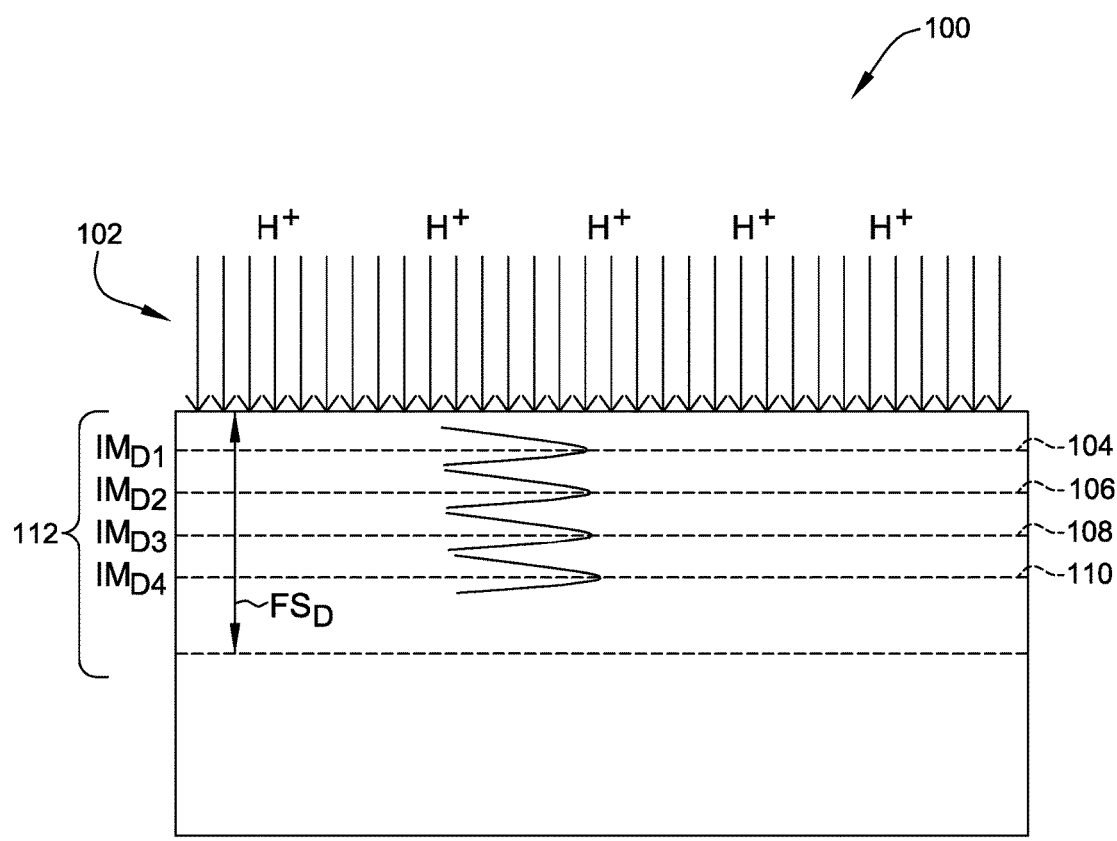
FIG. 5 is a depiction of a single crystal handle substrate comprising multiple planes of peak hydrogen ion concentration.

In some embodiments of the process of the present invention and with reference to FIG. 5, hydrogen ions (represented by 102) are implanted through the front surface of the single crystal semiconductor handle substrate 100 to different depths of peak hydrogen ion concentration (the peak depths are labeled $IM_{D1}$, $IM_{D2}$, $IM_{D3}$, $IM_{D4}$) in the front surface region 112 of the substrate 100. In some embodiments, the hydrogen ion implantation comprises hydrogen ion implantation to two or more depths of peak hydrogen ion concentration, such as three or more depths of peak hydrogen ion concentration, or even four or more depths of peak hydrogen ion concentration, such as five, six, or even seven peak depths of hydrogen ion concentration. Instrumentation for hydrogen ion implantation may be any tool currently available suitable for such purpose. For example, the tool may be the VIISta implantation tool described in Shengwu Chang. Gori, B.; Norris, C.; Klein, J.; Decker-Lucke, K. High energy hydrogen and helium ion implanter, Published in: 20th International Conference on Ion Implantation Technology (IIT), Jun. 26 2014-Jul. 4 2014, pp 1-4. FIG. 5 depicts a single crystal handle substrate 100 comprising multiple planes 104, 106, 108, and 110 of peak hydrogen ion concentration having depths $IM_{D1}$, $IM_{D2}$, $IM_{D3}$, and $IM_{D4}$ in the front surface region 112 of the handle substrate 100. The front surface region 112 of the handle substrate 100 has a depth $FS_D$. The multiple planes 104, 106, 108, and 110 of peak hydrogen ion concentration having depths $IM_{D1}$, $IM_{D2}$, $IM_{D3}$, and $IM_{D4}$ are formed by multiple hydrogen ion implantation 102 steps performed at several different implantation energies. Hydrogen ion implantation 102 generally results in a peak hydrogen ion concentration in the front surface region 112, and a generally decreasing hydrogen ion concentration on each side of the peak ion concentration (at planes 104, 106, 108, and 110), as further depicted in FIG. 5. The regions of peak hydrogen ion concentration at depths $IM_{D1}$, $IM_{D2}$, $IM_{D3}$, and $IM_{D4}$ act as a template for the three-dimensional network of cavities and dislocations, which forms from a two-step anneal. See FIG. 6 for an exemplary depiction of a three-dimensional network of cavities and dislocations, with planes of cavities generally corresponding to peak hydrogen ion concentration having depths $IM_{D1}$, $IM_{D2}$, $IM_{D3}$, and $IM_{D4}$. The three-dimensional network may act as a charge trapping layer in a resultant semiconductor-on-insulator structure. The two-step anneal, which follows hydrogen ion implantation 102, results in a generally planar distribution of cavities that forms at or near the peak hydrogen ion concentrations having depths $IM_{D1}$, $IM_{D2}$, $IM_{D3}$, and $IM_{D4}$, which are interconnected by dislocations. Some dislocations interconnecting the cavities may be generally "horizontal" in the sense that some dislocations may connect cavities generally within the same plane, while some dislocations may be generally "vertical" in the sense that dislocations may connect cavities in adjacent planes. Accordingly, the three dimensional network of cavities and dislocations is imprinted by the hydrogen ion implantation.

According to some embodiments of the present invention, hydrogen ions may be implanted to a first implant depth, $IM_{D1}$, corresponding to a first peak hydrogen ion concentration in the front surface region 112 of the single crystal semiconductor handle substrate 100, wherein $IM_{D1}$ is measured from the front surface of the single crystal semiconductor handle substrate 100 and toward the central plane. The plane of peak hydrogen ion concentration at the first implant depth, $IM_{D1}$, is depicted as 104 in FIG. 5. After implantation to this first implant depth, a second hydrogen ion implantation step may occur at a different implant energy to a second implant depth, $IM_{D2}$, corresponding to a second peak hydrogen ion concentration in the front surface region 112 of the single crystal semiconductor handle substrate 100, wherein $IM_{D2}$ is measured from the front surface of the single crystal semiconductor handle substrate 100 and toward the central plane. The plane of peak hydrogen ion concentration at the second implant depth, $IM_{D2}$, is depicted as 106 in FIG. 5. Hydrogen ion implantation may be continued at different implant energies to result in third implant depth ($IM_{D3}$), a fourth implant depth ($IM_{D4}$), and so on. The plane of peak hydrogen ion concentrations at the third implant depth, $IM_{D3}$, and the fourth implant depth, $IM_{D4}$, are depicted as 108 and 110 in FIG. 5. In general, the distance between two adjacent planes of peak hydrogen ion concentration should be least about 10 nanometers but no more than about 750 nanometers, such as at least about 10 nanometers and by no more than about 500 nanometers, or at least about 10 nanometers and by no more than about 250 nanometers, or at least about 10 nanometers and by no more than about 100 nanometers, or at least about 10 nanometers and by no more than about 50 nanometers. For example, the first implant depth, $IM_{D1}$, corresponding to the plane of first peak hydrogen ion concentration 104 and the second implant depth, $IM_{D2}$, corresponding to the plane of second peak hydrogen ion concentration 106 are separated by at least about 10 nanometers but no more than about 750 nanometers, such as at least about 10 nanometers and by no more than about 500 nanometers, or at least about 10 nanometers and by no more than about 250 nanometers, or at least about 10 nanometers and by no more than about 100 nanometers, or at least about 10 nanometers and by no more than about 50 nanometers. These ranges of separation between the first and second implant depths may apply to each additional depth of peak hydrogen ion concentration, e.g., the separation between $IM_{D2}$ and $IM_{D3}$, or between $IM_{D3}$ and $IM_{D4}$, and so on.

In some embodiments of the invention, the first implant depth, $IM_{D1}$, corresponding to the plane 104 of first peak hydrogen ion concentration is between about 0.05 micrometer and about 2.0 micrometers, such as between about 0.07 micrometer and about 1.0 micrometer, or between about 0.1 micrometer and about 0.4 micrometer, or between about 0.1 micrometer and about 0.3 micrometer. In some embodiments, the hydrogen ion implant dosage for the first implant depth, $IM_{D1}$, is between about $1 \times 10^{15}$ protons/cm$^2$ and about $1 \times 10^{18}$ protons/cm$^2$, such as between about $5 \times 10^{15}$ protons/cm$^2$ and about $1 \times 10^{17}$ protons/cm$^2$, such as about $1 \times 10^{16}$ protons/cm$^2$. The hydrogen ion implant energy for the first implant depth, $IM_{D1}$, is between about 10 keV and about 500 keV, such as between about 10 keV and about 100 keV, or between about 10 keV and about 50 keV, or between about 10 keV and about 30 keV.

In some embodiments of the invention, the second implant depth, $IM_{D2}$, corresponding to the plane 106 of second peak hydrogen ion concentration is between about 0.10 micrometer and about 5.0 micrometers, such as between about 0.20 micrometer and about 1.0 micrometer, or between about 0.30 micrometer and about 0.6 micrometer, or between about 0.35 micrometer and about 0.50 micrometer. In some embodiments, the hydrogen ion implant dosage for the second implant depth, $IM_{D2}$, is between about $1 \times 10^{15}$ protons/cm$^2$ and about $1 \times 10^{18}$ protons/cm$^2$, such as between about $5 \times 10^{15}$ protons/cm$^2$ and about $1 \times 10^{17}$ protons/cm$^2$, such as about $1 \times 10^{16}$ protons/cm$^2$. The hydrogen ion implant energy for the second implant depth, $IM_{D2}$, is between about 10 keV and about 500 keV, such as between about 20 keV and about 100 keV, or between about 25 keV and about 75 keV, or between about 30 keV and about 50 keV.

In some embodiments of the invention, additional ion implantation steps are performed, such as a third, fourth, or more ion implantations are performed at higher electron energies to yield deeper depths of peak hydrogen ion concentration. In some embodiments of the invention, the third implant depth, $IM_{D3}$, corresponding to the plane 108 of third peak hydrogen ion concentration is between about 0.15 micrometer and about 7.5 micrometers, such as between about 0.30 micrometer and about 2.0 micrometers, or between about 0.45 micrometer and about 0.80 micrometer, or between about 0.50 micrometer and about 0.65 micrometer. In some embodiments, the hydrogen ion implant dosage for the third implant depth, $IM_{D3}$, is between about $1 \times 10^{15}$ protons/cm$^2$ and about $1 \times 10^{18}$ protons/cm$^2$, such as between about $5 \times 10^{15}$ protons/cm$^2$ and about $1 \times 10^{17}$ protons/cm$^2$, such as about $1 \times 10^{16}$ protons/cm$^2$. The hydrogen ion implant energy for the third implant depth, $IM_{D3}$, is between about 10 keV and about 500 keV, such as between about 30 keV and about 200 keV, or between about 40 keV and about 100 keV, or between about 50 keV and about 70 keV.

In some embodiments of the invention, the fourth implant depth, $IM_{D4}$, corresponding to the plane 110 of fourth peak hydrogen ion concentration is between about 0.20 micrometer and about 10.0 micrometers, such as between about 0.40 micrometer and about 3.0 micrometers, or between about 0.60 micrometer and about 1.0 micrometer, or between about 0.65 micrometer and about 1.0 micrometer. In some embodiments, the hydrogen ion implant dosage for the fourth implant depth, $IM_{D4}$, is between about $1 \times 10^{15}$ protons/cm$^2$ and about $1 \times 10^{18}$ protons/cm$^2$, such as between about $5 \times 10^{15}$ protons/cm$^2$ and about $1 \times 10^{17}$ protons/cm$^2$, such as about $1 \times 10^{16}$ protons/cm$^2$. The hydrogen ion implant energy for the fourth implant depth, $IM_{D4}$, is between about 10 keV and about 500 keV, such as between about 50 keV and about 300 keV, or between about 60 keV and about 150 keV, or between about 70 keV and about 90 keV.

Still further hydrogen ion implantation steps may be performed at higher implant energies and dosages to form implant planes of peak hydrogen ion concentrations at deeper depths within the front surface region. In some embodiments, four ion implantation steps may be generally suitable to prepare a robust three-dimensional network of cavities and dislocations within the handle substrate that acts as a thermally stable charge trapping layer.

After hydrogen ion implantation to thereby yield a single crystal semiconductor handle substrate comprising two or more planes of peak hydrogen ion concentration (e.g., planes 104, 106, 108, and 110 as depicted in FIG. 5), the single crystal semiconductor handle substrate 100 is subjected to a two-step anneal to thereby form, within the front surface region, a three-dimensional network of cavities and dislocations that is thermally stable. See FIG. 6 for an exemplary depiction of a three-dimensional network of cavities and dislocations, with planes of cavities generally corresponding to peak hydrogen ion concentration having depths $IM_{D1}$, $IM_{D2}$, $IM_{D3}$, and $IM_{D4}$. The three-dimensional network may act as a charge trapping layer in a resultant semiconductor-on-insulator structure.

The anneal comprises two stages at two different temperature ranges. In a first step of the anneal, the hydrogen ion implanted single crystal semiconductor handle substrate is subjected to a first temperature and a first duration sufficient to form cavities at the implant depths of peak hydrogen ion concentration. The first step of the anneal is sufficient to from cavities, which themselves are formed by the collection of implanted hydrogen into gaseous bubbles and the out diffusion of the gaseous hydrogen bubbles. In some embodiments, the temperature of the first anneal step may be between about 600° C. and about 800° C. In some embodiments, the duration of the first anneal step may be between about 10 minutes and about 10 hours, such as between about 10 minutes and about 2 hours, or between about 2 hours and about 8 hours. In the defect structure formed by the first anneal, the characteristic distance between cavities is generally between about 10 nanometers and about 200 nanometers, such as between about 50 nanometers and about 150 nanometers, such as about 100 nm. After the first anneal, the cavities may have an average size between about 1 nanometer and about 50 nanometers, such as between about 5 nanometers and about 25 nanometers, such as about 10 nm. The distance between planes of cavities, which generally correspond to the peak hydrogen ion implant depths, may be between about 10 nanometers and about 500 nanometers, such as between about 20 nanometers and about 200 nanometers. These depths may be selected by choosing the energies of hydrogen ions. The average cavity size is controlled by choosing combination of implant dose and thermal budget of first step of the anneal.

In a second step of the anneal, the single crystal semiconductor handle substrate comprising cavities is subjected to a second temperature and a second duration sufficient to interconnect the cavities and thereby form the three-dimensional network of dislocations and cavities in the front surface region of the single crystal semiconductor handle substrate. In some embodiments, the temperature of the first anneal step may be between about 900° C. and about 1200° C. In some embodiments, the duration of the second anneal step may be between about 10 minutes and about 10 hours, such as between about 10 minutes and about 2 hours, or between about 2 hours and about 8 hours. In general, the conditions chosen for the second anneal do not noticeably affect cavity sizes and distance between the cavities. However, thermal budget to this anneal may be selected to form interconnecting dislocations between each pair of neighboring cavities. If upon previous processing (implant and first anneal) average distances between the cavities is small ~50 nm, the second step anneal can be done at thermal budget close to lower side (e.g., 900° C./10 minutes). If upon previous processing (implant and first anneal) average distances between the cavities is big ~250 nm, the second step anneal can be done at thermal budget close to higher side (e.g., 1200° C./10 hours).

With reference again to FIG. 4, a semiconductor-on-insulator structure 40 may be manufactured to comprise a thermally stable charge trapping layer 44 comprising a three-dimensional network of cavities and dislocations incorporated at or near the interface of the handle substrate 42 with the dielectric layer 46 (e.g., buried oxide). The conventional layer transfer technique to transfer a device layer 48 onto a handle substrate 42 comprising the charge trapping layer 44 of the present invention or subsequent device manufacturing steps may include one or more high temperature processes. While anneal may cause the cavities to lose trapping capacity, because they undergo oxidation of their internal walls, dislocations do not lose their trapping efficiency, and the trap rich band serves as an efficient charge trapping material. Accordingly, the role of the cavities may not necessarily be as a charge trapping structure, but rather as locking points for the dislocations, so this unique dislocation network survives high temperature treatments without getting annealed out.

In some embodiments, the three-dimensional network of dislocations and cavities is at least about 0.1 micrometers thick, such as at least about 0.25 micrometers thick, such as between about 0.1 micrometers thick and about 20 micrometers thick, or between about 0.1 micrometers thick and about 10 micrometers thick, or between about 0.2 micrometers and about 5 micrometers thick, or between about 0.25 micrometers and about 2 micrometers thick. In some embodiments, the three-dimensional network of dislocations and cavities may comprise two or more two-dimensional networks of dislocations and cavities. Each two-dimensional network may comprise a substantially planar network of cavities interconnected by horizontal dislocations. Further, the two-step anneal results in a three-dimensional network comprising two or more two-dimensional networks of dislocations and cavities are interconnected by vertical dislocations. In some embodiments, the three-dimensional network of dislocations and cavities comprises three or more two-dimensional networks of dislocations and cavities, wherein each two-dimensional network comprises a substantially planar network of cavities interconnected by horizontal dislocations. Moreover, the three or more two-dimensional networks of dislocations and cavities are interconnected by vertical dislocations.

After the steps described above, cleaning of the handle substrate is optional. If desired, the wafers can be cleaned, for example, in a standard SC1/SC2 solution. Additionally, the wafers, particularly, the semiconductor oxide layer on the front surface of the handle substrate, may be subjected to chemical mechanical polishing (CMP) to reduce the surface roughness, preferably to the level of $RMS_{2 \times 2 \ um2}$ is less than about 5 angstroms, wherein root mean squared—

$$R_q = \sqrt{\frac{1}{n}\sum_{i=1}^{n} y_i^2},$$

the roughness profile contains ordered, equally spaced points along the trace, and $y_i$ is the vertical distance from the mean line to the data point.

Semiconductor-on-insulator manufacture may occur according to conventional layer transfer techniques. The single crystal semiconductor handle wafer prepared according to the method described herein to comprise a charge trapping layer is next bonded a single crystal semiconductor donor substrate, e.g., a single crystal semiconductor donor wafer, which is prepared according to conventional layer transfer methods. The single crystal semiconductor donor substrate may be a single crystal semiconductor wafer. In preferred embodiments, the semiconductor wafer comprises a semiconductor material selected from the group consisting of silicon, silicon carbide, sapphire, aluminum nitride, silicon germanium, gallium arsenide, gallium nitride, indium phosphide, indium gallium arsenide, germanium, and combinations thereof. Depending upon the desired properties of the final integrated circuit device, the single crystal semiconductor (e.g., silicon) donor wafer may comprise a dopant selected from the group consisting of boron, arsenic, and phosphorus. The resistivity of the single crystal semiconductor (e.g., silicon) donor wafer may range from 1 to 50 Ohm-cm, typically, from 5 to 25 Ohm-cm. The single crystal semiconductor donor wafer may be subjected to standard process steps including oxidation, implant, and post implant cleaning. Accordingly, a semiconductor donor substrate, such as a single crystal semiconductor wafer of a material that is conventionally used in preparation of multilayer semiconductor structures, e.g., a single crystal silicon donor wafer, that has been etched and polished and optionally oxidized, is subjected to ion implantation to form a damage layer in the donor substrate.

In some embodiments, the semiconductor donor substrate comprises a dielectric layer, i.e., an insulating layer. Suitable dielectric layers may comprise a material selected from among silicon dioxide, silicon nitride, silicon oxynitride, hafnium oxide, titanium oxide, zirconium oxide, lanthanum oxide, barium oxide, and a combination thereof. In some embodiments, the dielectric layer comprises an oxide layer having a thickness of at least about 10 nanometer thick, such as between about 10 nanometers and about 10,000 nanometers, between about 10 nanometers and about 5,000 nanometers, or between about 100 nanometers and about 800 nanometers, such as about 50 nanometers, 100 nanometers, 200 nanometers, or about 600 nanometers.

In some embodiments, the dielectric layer comprises one or more insulating material selected from the group consisting of silicon dioxide, silicon nitride, silicon oxynitride, and any combination thereof. In some embodiments, the dielectric layer has a thickness of at least about 10 nanometer thick, such as between about 10 nanometers and about 10,000 nanometers, between about 10 nanometers and about 5,000 nanometers, or between about 100 nanometers and about 800 nanometers, such as about 50 nanometers, 100 nanometers, 200 nanometers, or about 600 nanometers.

In some embodiments, the dielectric layer comprises multiple layers of insulating material. The dielectric layer may comprise two insulating layers, three insulating layers, or more. Each insulating layer may comprise a material selected from among silicon dioxide, silicon oxynitride, silicon nitride, hafnium oxide, titanium oxide, zirconium oxide, lanthanum oxide, barium oxide, and any combination thereof. In some embodiments, each insulating layer may comprise a material selected from the group consisting of silicon dioxide, silicon nitride, siliconoxynitride, and any combination thereof. Each insulating layer may have a thickness of at least about 10 nanometer thick, such as between about 10 nanometers and about 10,000 nanometers, between about 10 nanometers and about 5,000 nanometers, or between about 100 nanometers and about 800 nanometers, such as about 50 nanometers, 100 nanometers, 200 nanometers, or about 600 nanometers.

In some embodiments, the front surface of the single crystal semiconductor donor substrate (e.g., a single crystal silicon donor substrate) may be thermally oxidized (in which some portion of the deposited semiconductor material film will be consumed) to prepare the semiconductor oxide film, or the semiconductor oxide (e.g., silicon dioxide) film may be grown by CVD oxide deposition. In some embodiments, the front surface of the single crystal semiconductor donor substrate may be thermally oxidized in a furnace such as an ASM A400 in the same manner described above. In some embodiments, the donor substrates are oxidized to provide an oxide layer on the front surface layer of at least about 10 nanometer thick, such as between about 10 nanometers and about 10,000 nanometers, between about 10 nanometers and about 5,000 nanometers, or between about 100 nanometers and about 800 nanometers, such as about 50 nanometers, 100 nanometers, 200 nanometers, or about 600 nanometers.

Ion implantation may be carried out in a commercially available instrument, such as an Applied Materials Quantum II, a Quantum LEAP, or a Quantum X. Implanted ions include He, H, $H_2$, or combinations thereof. Ion implantation is carried out as a density and duration sufficient to form a damage layer in the semiconductor donor substrate. Implant density may range from about $10^{12}$ ions/cm$^2$ to about $10^{17}$ ions/cm$^2$, such as from about $10^{14}$ ions/cm$^2$ to about $10^{17}$ ions/cm$^2$, such as from about $10^{15}$ ions/cm$^2$ to about $10^{16}$ ions/cm$^2$. Implant energies may range from about 1 keV to about 3,000 keV, such as from about 5 keV to about 1,000 keV, or from about 5 keV to about 200 keV, or from 5 keV to about 100 keV, or from 5 keV to about 80 keV. The depth of implantation determines the thickness of the single crystal semiconductor device layer in the final SOI structure. In some embodiments it may be desirable to subject the single crystal semiconductor donor wafers, e.g., single crystal silicon donor wafers, to a clean after the implant. In some preferred embodiments, the clean could include a Piranha clean followed by a DI water rinse and SC1/SC2 cleans.

In some embodiments of the present invention, the single crystal semiconductor donor substrate having an ion implant region therein formed by helium ion and/or hydrogen ion implant is annealed at a temperature sufficient to form a thermally activated cleave plane in the single crystal semiconductor donor substrate. An example of a suitable tool might be a simple Box furnace, such as a Blue M model. In some preferred embodiments, the ion implanted single crystal semiconductor donor substrate is annealed at a temperature of from about 200° C. to about 350° C., from about 225° C. to about 325° C., preferably about 300° C. Thermal annealing may occur for a duration of from about 2 hours to about 10 hours, such as from about 2 hours to about 8 hours. Thermal annealing within these temperatures ranges is sufficient to form a thermally activated cleave plane. After the thermal anneal to activate the cleave plane, the single crystal semiconductor donor substrate surface is preferably cleaned.

In some embodiments, the ion-implanted and optionally cleaned and optionally annealed single crystal semiconductor donor substrate is subjected to oxygen plasma and/or nitrogen plasma surface activation. In some embodiments, the oxygen plasma surface activation tool is a commercially available tool, such as those available from EV Group, such as EVG®810LT Low Temp Plasma Activation System. The ion-implanted and optionally cleaned single crystal semiconductor donor wafer is loaded into the chamber. The chamber is evacuated and backfilled with $O_2$ to a pressure less than atmospheric to thereby create the plasma. The single crystal semiconductor donor wafer is exposed to this plasma for the desired time, which may range from about 1 second to about 120 seconds. Oxygen plasma surface oxidation is performed in order to render the front surface of the single crystal semiconductor donor substrate hydrophilic and amenable to bonding to a single crystal semiconductor handle substrate prepared according to the method described above.

The hydrophilic front surface layer of the single crystal semiconductor donor substrate and the front surface of the single crystal semiconductor handle substrate, which is optionally oxidized, are next brought into intimate contact to thereby form a bonded structure. The bonded structure comprises a dielectric layer, e.g., a buried oxide, with a portion of the dielectric layer contributed by the oxidized front surface of the single crystal semiconductor handle substrate and a portion of the dielectric layer contributed by the oxidized front surface of the single crystal semiconductor donor substrate. In some embodiments, the dielectric layer, e.g., buried oxide layer, has a thickness of at least about 10 nanometer thick, such as between about 10 nanometers and about 10,000 nanometers, between about 10 nanometers and about 5,000 nanometers, or between about 100 nanometers and about 800 nanometers, such as about 50 nanometers, 100 nanometers, 200 nanometers, or about 600 nanometers.

Since the mechanical bond is relatively weak, the bonded structure is further annealed to solidify the bond between the donor wafer and the handle wafer. In some embodiments of the present invention, the bonded structure is annealed at a temperature sufficient to form a thermally activated cleave plane in the single crystal semiconductor donor substrate. An example of a suitable tool might be a simple Box furnace, such as a Blue M model. In some preferred embodiments, the bonded structure is annealed at a temperature of from about 200° C. to about 350° C., from about 225° C. to about 325° C., preferably about 300° C. Thermal annealing may occur for a duration of from about 0.5 hours to about 10 hour, preferably a duration of about 2 hours. Thermal annealing within these temperatures ranges is sufficient to form a thermally activated cleave plane. After the thermal anneal to activate the cleave plane, the bonded structure may be cleaved.

After the thermal anneal, the bond between the single crystal semiconductor donor substrate and the single crystal semiconductor handle substrate is strong enough to initiate layer transfer via cleaving the bonded structure at the cleave plane. Cleaving may occur according to techniques known in the art. In some embodiments, the bonded structure may be placed in a conventional cleave station affixed to stationary suction cups on one side and affixed by additional suction cups on a hinged arm on the other side. A crack is initiated near the suction cup attachment and the movable arm pivots about the hinge cleaving the wafer apart. Cleaving removes a portion of the semiconductor donor wafer, thereby leaving a semiconductor device layer, preferably a silicon device layer, on the semiconductor-on-insulator composite structure.

After cleaving, the cleaved structure may be subjected to a high temperature anneal in order to further strengthen the bond between the transferred device layer and the single crystal semiconductor handle substrate. An example of a suitable tool might be a vertical furnace, such as an ASM A400. In some preferred embodiments, the bonded structure is annealed at a temperature of from about 1000° C. to about 1200° C., preferably at about 1000° C. Thermal annealing may occur for a duration of from about 0.5 hours to about 8 hours, preferably a duration of about 4 hours. Thermal annealing within these temperatures ranges is sufficient to strengthen the bond between the transferred device layer and the single crystal semiconductor handle substrate.

After the cleave and high temperature anneal, the bonded structure may be subjected to a cleaning process designed to remove thin thermal oxide and clean particulates from the surface. In some embodiments, the single crystal semiconductor donor wafer may be brought to the desired thickness and smoothness by subjecting to a vapor phase HCl etch process in a horizontal flow single wafer epitaxial reactor using $H_2$ as a carrier gas. In some embodiments, an epitaxial layer may be deposited on the transferred device layer.

With reference again to FIG. 4, the finished multilayer structure comprises a SOI wafer 40 comprising the high resistivity single crystal semiconductor handle substrate 42 (e.g., a single crystal silicon handle substrate), a charge trapping layer 44, a dielectric layer 46 (e.g., buried oxide layer) prepared from oxidation of the single crystal semiconductor donor substrate, and the semiconductor device layer 48 (prepared by thinning the donor substrate), may then be subjected to end of line metrology inspections and cleaned a final time using typical SC1-SC2 process. The front surface region of the single crystal semiconductor handle substrate 42 comprises a charge trapping layer 44 comprising the three-dimensional network of dislocations and cavities at or near the interface of the handle substrate with the dielectric layer 46. The three-dimensional network of dislocations and cavities extends generally from a first plane facing the front surface side of the substrate toward a second plane facing the imaginary central plane of the substrate. The three-dimensional network of dislocations and cavities is at least about 0.1 micrometers thick, such as at least about 0.25 micrometers thick, such as between about 0.1 micrometers thick and about 10 micrometers thick, or between about 0.2 micrometers and about 5 micrometers thick, or between about 0.25 micrometers and about 2 micrometers thick.

Radiofrequency chips of enhanced quality can be fabricated from this SOI wafer 40 since the structure comprises a network of dislocations and cavities that are thermally stable to temperatures of at least about 1180° C. The network acts as a sufficient charge trapping layer since the dislocations do not lose their trapping efficiency and keep the trap rich band to serve efficiently.

Having described the invention in detail, it will be apparent that modifications and variations are possible without departing from the scope of the invention defined in the appended claims.

The following non-limiting examples further illustrate the present invention.

Example 1

200 mm single side polished wafers with resistivity >1000 Ohm-cm are used an an embodiment of the process of the invention. The wafers are cleaned using a Pirahna clean process to remove organic and particulate contamination. The wafers are subjected to a 1000° C. wet oxidation process to grow 2400 angstrom of silicon dioxide. The wafers are processed through an SC1-SC2 clean.

The wafers are implanted with $H^+$ using successive implant energies of 23 keV, 41 keV, 60 keV, and 80 keV. Each implant provides a dose of $1\times10^{16}$ atoms/cm$^2$ each providing a total implantation dose is $4\times10^{16}$ atoms/cm$^2$. Under these implant conditions, there are peak hydrogen ion concentrations at 0.25 micrometers, 0.40 micrometers, 0.55 micrometers, and 0.7 micrometers below wafer surface. The distance between cavity planes in the final quasi-lattice can be controlled from 20 to 200 nm by proper choosing of energies of hydrogen ions. After 4 implantations, and a further 2-stage anneal, a three-dimensional network comprising 4-stage quasi-lattice of cavities interconnected by dislocations will be formed. In the defect structure formed by the anneal, the characteristic distance between cavities is around 100 nm and characteristic size of the cavities is 10 nm.

The implanted wafers are annealed by 2-stage process. The first anneal step forms cavities by collecting the implanted hydrogen into gaseous bubbles and then out diffusion of the hydrogen leaving empty cavities. The average cavity size is controlled by selecting the implant dose and thermal budget of first step of the anneal. Using higher dose and higher thermal budget results in bigger size cavities. The in-plane distance between neighboring cavities is also controlled by combination of implant dose and budget of the first anneal. The temperature of the first step annealing is between 600° C. to 800° C., for between 10 minutes to 10 hours. In general, dislocations connecting neighboring cavities are typically not formed at this stage.

Second annealing step is performed at temperatures 900° C. to 1200° C., for between 10 minutes to 10 hours. The conditions chosen for the second anneal does not affect cavity sizes and distance between the cavities. However, thermal budget to this oxidation should be chosen to form interconnecting dislocations between each pair of neighboring cavities. If upon previous processing (implant and first anneal) average distances between the cavities is small ~50 nm, the second step anneal can be done at thermal budget close to lower side (900 C/10 minutes). If upon previous processing (implant and first anneal) average distances between the cavities is big ~250 nm, the second step anneal can be done at thermal budget close to higher side (1200 C/10 hours).

Donor wafers were prepared for layer transfer via standard processes including oxidation, implant, post implant cleaning. The donors and the handle wafers prepared according to the process of the present invention were subjected to a nitrogen plasma activation process and were bonded. The bonded pairs were subjected to a short thermal cycle to strengthen bonding between the donor and handle wafers and simultaneously evolving helium and hydrogen in ion implanted plane to the level that mechanical strength of the gas-implanted plane becomes lower than mechanical strength of partially bonded interface. The wafers were then mechanically cleaved causing transfer of the donor oxide and thin layer of Si from the donor wafer onto the handle wafer. The resulting SOI wafer was cleaned using an SC1-SC2 clean process and subjected to a high temperature anneal 1100° C.) to finalize strengthening the bond interface. After the high temperature anneal the wafers were subjected to clean process designed to remove thin thermal oxide and clean particulates from the surface. The top Si of the SOI wafers was brought to target thickness and smoothness by subjecting to a vapor phase HCl etch process in a horizontal flow single wafer epitaxial reactor using $H_2$ as a carrier gas. The finished SOI wafer was the subjected to end of line metrology inspections and cleaned a final time using typical SC1-SC2 process.

As various changes could be made in the above compositions and processes without departing from the scope of the invention, it is intended that all matter contained in the above description be interpreted as illustrative and not in a limiting sense.

When introducing elements of the present invention or the preferred embodiment(s) thereof, the articles "a," "an,"

"the," and "said" are intended to mean that there are one or more of the elements. The terms "comprising," "including," and "having" are intended to be inclusive and mean that there may be additional elements other than the listed elements.

What is claimed is:

1. A method of preparing a single crystal semiconductor handle substrate, the single crystal semiconductor handle substrate comprising two major, generally parallel surfaces, one of which is a front surface of the semiconductor handle substrate and the other of which is a back surface of the semiconductor handle substrate, an imaginary central plane between the front surface and the back surface, a circumferential edge joining the front and back surfaces of the semiconductor handle substrate, a front surface region extending from the front surface and toward the central plane and having a depth, $FS_D$, and a bulk region between the front and back surfaces of the semiconductor handle substrate, wherein the semiconductor handle substrate has a minimum bulk region resistivity of at least about 500 ohm-cm, and the method comprises:

implanting hydrogen ions to a first implant depth, $IM_{D1}$, corresponding to a plane of a first peak hydrogen ion concentration in the front surface region of the single crystal semiconductor handle substrate, wherein $IM_{D1}$ is measured from the front surface of the single crystal semiconductor handle substrate and toward the central plane;

implanting hydrogen ions to a second implant depth, $IM_{D2}$, corresponding to a plane of a second peak hydrogen ion concentration in the front surface region of the single crystal semiconductor handle substrate, wherein $IM_{D2}$ is measured from the front surface of the single crystal semiconductor handle substrate and toward the central plane; and annealing the hydrogen ion implanted single crystal semiconductor handle substrate at a temperature and a duration sufficient to form a three-dimensional network of dislocations and cavities in the front surface region of the single crystal semiconductor handle substrate, wherein the depth, $FS_D$, of the front surface region is less than 20 micrometers, and further wherein the first implant depth, $IM_{D1}$, corresponding to the plane of the first peak hydrogen ion concentration and the second implant depth, $IM_{D2}$, corresponding to the plane of the second peak hydrogen ion concentration are separated by at least about 10 nanometers and no more than about 750 nanometers.

2. The method of claim 1 wherein the single crystal semiconductor handle substrate comprises a silicon wafer.

3. The method of claim 1 wherein the single crystal semiconductor handle substrate comprises a silicon wafer sliced from a single crystal silicon ingot grown by the Czochralski method or the float zone method.

4. The method of claim 1 wherein the single crystal semiconductor handle substrate has a bulk resistivity between about 500 Ohm-cm and about 100,000 Ohm-cm.

5. The method of claim 1 wherein the single crystal semiconductor handle substrate has a bulk resistivity between about 1000 Ohm-cm and about 100,000 Ohm-cm.

6. The method of claim 1 wherein the single crystal semiconductor handle substrate has a bulk resistivity between about 1000 ohm cm and about 10,000 Ohm-cm.

7. The method of claim 1 wherein the single crystal semiconductor handle substrate has a bulk resistivity between about 2000 Ohm cm and about 10,000 Ohm-cm.

8. The method of claim 1 wherein the single crystal semiconductor handle substrate has a bulk resistivity between about 3000 Ohm-cm and about 10,000 Ohm-cm.

9. The method of claim 1 wherein the single crystal semiconductor handle substrate has a bulk resistivity between about 3000 Ohm cm and about 5,000 Ohm-cm.

10. The method of claim 1 wherein the first implant depth, $IM_{D1}$, corresponding to the plane of the first peak hydrogen ion concentration and the second implant depth, $IM_{D2}$, corresponding to the plane of the second peak hydrogen ion concentration are separated at least about 10 nanometers and by no more than about 500 nanometers.

11. The method of claim 1 wherein the first implant depth, $IM_{D1}$, corresponding to the plane of the first peak hydrogen ion concentration and the second implant depth, $IM_{D2}$, corresponding to the plane of the second peak hydrogen ion concentration are separated at least about 10 nanometers and by no more than about 250 nanometers.

12. The method of claim 1 wherein the first implant depth, $IM_{D1}$, corresponding to the plane of the first peak hydrogen ion concentration and the second implant depth, $IM_{D2}$, corresponding to the plane of the second peak hydrogen ion concentration are separated at least about 10 nanometers and by no more than about 100 nanometers.

13. The method of claim 1 wherein the first implant depth, $IM_{D1}$, corresponding to the plane of the first peak hydrogen ion concentration and the second implant depth, $IM_{D2}$, corresponding to the plane of the second peak hydrogen ion concentration are separated at least about 10 nanometers and by no more than about 50 nanometers.

14. The method of claim 1 wherein the first implant depth, $IM_{D1}$, corresponding to the plane of the first peak hydrogen ion concentration is between about 0.05 micrometer and about 2.0 micrometers.

15. The method of claim 1 wherein the second implant depth, $IM_{D2}$, corresponding to plane of the second peak hydrogen ion concentration is between about 0.10 micrometer and about 5.0 micrometers.

16. The method of claim 1 wherein the hydrogen ion implant dosage for the first implant depth, $IM_{D1}$, is between about $1 \times 10^{15}$ protons/cm$^2$ and about $1 \times 10^{18}$ protons/cm$^2$.

17. The method of claim 1 wherein the hydrogen ion implant dosage for the second implant depth, $IM_{D2}$, is between about $1 \times 10^{15}$ protons/cm$^2$ and about $1 \times 10^{18}$ protons/cm$^2$.

18. The method of claim 1 wherein the hydrogen ion implant energy for the first implant depth, $IM_{D1}$, is between about 10 keV and about 500 keV.

19. The method of claim 1 wherein the hydrogen ion implant energy for the second implant depth, $IM_{D2}$, is between about 10 keV and about 500 keV.

20. The method of claim 1 further comprising implanting hydrogen ions to a third implant depth, $IM_{D3}$, corresponding to a plane of a third peak hydrogen ion concentration in the front surface region of the single crystal semiconductor handle substrate, wherein $IM_{D3}$ is measured from the front surface of the single crystal semiconductor handle substrate and toward the central plane.

21. The method of claim 20 wherein the third implant depth, $IM_{D3}$, corresponding to the plane of the third peak hydrogen ion concentration is between about 0.15 micrometer and about 7.5 micrometers.

22. The method of claim 20 wherein the hydrogen ion implant dosage for the third implant depth, $IM_{D3}$, is between about $1 \times 10^{15}$ protons/cm$^2$ and about $1 \times 10^{18}$ protons/cm$^2$.

23. The method of claim 20 wherein the hydrogen ion implant energy for the third implant depth, $IM_{D3}$, is between about 10 keV and about 500 keV.

24. The method of claim 20 wherein the second implant depth, $IM_{D2}$, corresponding to the plane of the second peak hydrogen ion concentration and the third implant depth, $IM_{D3}$, corresponding to the plane of the third peak hydrogen ion concentration are separated at least about 10 nanometers and by no more than about 500 nanometers.

25. The method of claim 20 wherein the second implant depth, $IM_{D2}$, corresponding to the plane of the second peak hydrogen ion concentration and the third implant depth, $IM_{D3}$, corresponding to the plane of the third peak hydrogen ion concentration are separated at least about 10 nanometers and by no more than about 250 nanometers.

26. The method of claim 20 further comprising implanting hydrogen ions to a fourth implant depth, $IM_{D4}$, corresponding to a plane of a fourth peak hydrogen ion concentration in the front surface region of the single crystal semiconductor handle substrate, wherein $IM_{D4}$ is measured from the front surface of the single crystal semiconductor handle substrate and toward the central plane.

27. The method of claim 26 wherein the fourth implant depth, $IM_{D4}$, corresponding to the plane of the fourth peak hydrogen ion concentration is between about 0.20 micrometer and about 10.0 micrometers.

28. The method of claim 26 wherein the hydrogen ion implant dosage for the third implant depth, $IM_{D3}$, is between about $1 \times 10^{15}$ protons/cm$^2$ and about $1 \times 10^{18}$ protons/cm$^2$.

29. The method of claim 26 wherein the hydrogen ion implant energy for the third implant depth, $IM_{D3}$, is between about 10 keV and about 500 keV.

30. The method of claim 26 wherein the third implant depth, $IM_{D3}$, corresponding to the plane of the third peak hydrogen ion concentration and the fourth implant depth, $IM_{D4}$, corresponding to the plane of the fourth peak hydrogen ion concentration are separated at least about 10 nanometers and by no more than about 500 nanometers.

31. The method of claim 26 wherein the third implant depth, $IM_{D3}$, corresponding to the plane of the third peak hydrogen ion concentration and the fourth implant depth, $IM_{D4}$, corresponding to the plane of the fourth peak hydrogen ion concentration are separated at least about 10 nanometers and by no more than about 250 nanometers.

32. The method of claim 1 wherein the hydrogen ion implanted single crystal semiconductor handle substrate is annealed according to the following steps:
  (a) subjecting the hydrogen ion implanted single crystal semiconductor handle substrate to a first anneal at a first temperature and a first duration sufficient to form cavities at the first implant depth, $IM_{D1}$, and the second implant depth, $IM_{D2}$, said cavities forming by the collection of implanted hydrogen into gaseous bubbles and the out diffusion of the gaseous bubbles; and
  (b) subjecting the single crystal semiconductor handle substrate comprising the cavities at the first implant depth, $IM_{D1}$, and the second implant depth, $IM_{D2}$, at a second temperature and a second duration sufficient to interconnect the cavities and thereby form the three-dimensional network of dislocations and cavities in the front surface region of the single crystal semiconductor handle substrate.

33. The method of claim 32 wherein the first temperature is between about 600° C. and about 800° C.

34. The method of claim 33 wherein the first duration is between about 10 minutes and about 10 hours.

35. The method of claim 32 wherein the second temperature is between about 900° C. and about 1200° C.

36. The method of claim 35 wherein the second duration is between about 10 minutes and about 10 hours.

* * * * *